(12) United States Patent
Sastry et al.

(10) Patent No.: US 8,747,599 B2
(45) Date of Patent: Jun. 10, 2014

(54) PROCESS FOR MAKING SELF-PATTERNING SUBSTRATES AND THE PRODUCT THEREOF

(76) Inventors: Chidella Krishna Sastry, Andhra Pradesh (IN); Chidella Venkata Krishna Mohan Sharma, Andhra Pradesh (IN); Srinivas Tangirala, Andhra Pradesh (IN)

( * ) Notice: Subject to any disclaimer, the term of this patent is extended or adjusted under 35 U.S.C. 154(b) by 1532 days.

(21) Appl. No.: 12/230,055

(22) Filed: Aug. 22, 2008

(65) Prior Publication Data

US 2009/0297802 A1 Dec. 3, 2009

(30) Foreign Application Priority Data

May 29, 2008 (IN) .......................... 1299/CHE/2008

(51) Int. Cl.
*B32B 27/00* (2006.01)
(52) U.S. Cl.
USPC ........... 156/242; 427/58; 427/96.1; 427/98.4; 427/523; 427/525; 427/529; 427/530; 427/531
(58) Field of Classification Search
USPC ......... 427/58, 96.1, 98.4, 523, 525, 529, 530, 427/531
See application file for complete search history.

(56) References Cited

U.S. PATENT DOCUMENTS

| | | | | |
|---|---|---|---|---|
| 5,420,607 A | * | 5/1995 | Miller et al. | 345/156 |
| 7,374,813 B2 | * | 5/2008 | Sagiv et al. | 428/338 |
| 7,537,799 B2 | * | 5/2009 | Etheridge | 427/98.4 |
| 7,629,017 B2 | * | 12/2009 | Kodas et al. | 427/58 |
| 7,695,756 B2 | * | 4/2010 | Gallo et al. | 427/58 |
| 2002/0151161 A1 | * | 10/2002 | Furusawa | 438/597 |
| 2006/0005900 A1 | * | 1/2006 | Dorfman | 148/400 |
| 2008/0020214 A1 | * | 1/2008 | Kawai et al. | 428/457 |
| 2008/0053951 A1 | * | 3/2008 | Jia et al. | 216/12 |
| 2008/0213702 A1 | * | 9/2008 | Bae et al. | 430/315 |
| 2009/0114430 A1 | * | 5/2009 | Kim | 174/257 |
| 2011/0226733 A1 | * | 9/2011 | Zu et al. | 216/37 |
| 2012/0135237 A1 | * | 5/2012 | Gracias et al. | 428/402 |
| 2012/0247355 A1 | * | 10/2012 | Berniard et al. | 101/250 |

* cited by examiner

*Primary Examiner* — Mark A Osele
*Assistant Examiner* — Nickolas Harm
(74) *Attorney, Agent, or Firm* — Manabu Kanesaka

(57) ABSTRACT

The present invention relates to a process for making self-patterning substrates comprising the steps of providing electrically conductive traces on a substrate; pre-coating the substrate with at least a layer of complementary reactant electrically resistant reactant formulations; altering the conductivity of complementary reactant formulation selectively upon application of external source of energy and a self-patterning substrate using the said process.

31 Claims, 5 Drawing Sheets

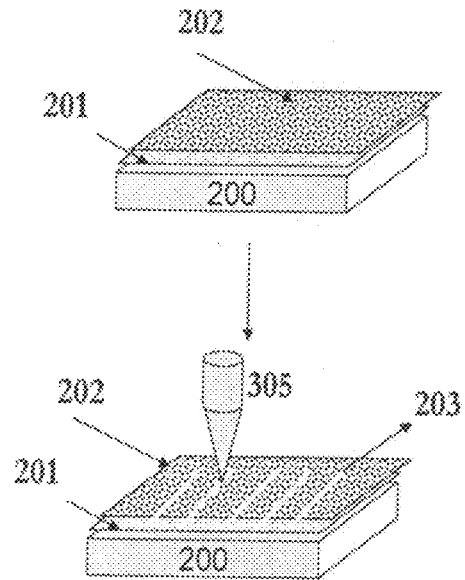

PROCESS FOR MAKING SELF-PATTERNING SUBSTRATES AND THE PRODUCT THEREOF

FIELD OF THE INVENTION

The present disclosure pertains to formation and printing of conductive patterns or coatings on a variety of substrates for electrical circuit related applications. More particularly, the present disclosure deals with the substrates pre-coated in part and/or in full with single or multiple layers of complementary reactant formulations with high electrical resistance that undergo chemical transformation upon exposure to an external energy source, to yield conductive patterns of desired resistance and resolution either through additive or subtractive printing/forming mechanisms.

BACKGROUND OF THE INVENTION

Printed circuit boards are used in a wide variety of electronic devices. The boards serve to support the electronic circuit components of the devices while "printed" filaments of conductive material (called traces) on the surface of the insulating board substrate, supply power to and interconnect the circuit components mounted on the board surface. In multilayer boards, some of the traces run between insulating layers in the interior of the board.

Printed traces or coatings perform the same function as wires but have several advantages over wires. For instance, since the traces are printed on the board, they are considerably less bulky than wire. Printed traces also eliminate the need for labor required to interconnect electronic components with wire, such as cutting the wire to appropriate lengths, stripping insulation off the wire, soldering individual wires to component leads, etc.

The electrical circuits on a substrate (e.g., printed circuit boards) are generally manufactured using etching/lithography technologies that involve time consuming processes (i.e., electroplating, masking, etching, etc.) and expensive tooling. For example U.S. Pat. No. 4,448,804 (by Amelio, W. J. et. al), U.S. Pat. No. 6,046,107 (by Lee, C. et. al), U.S. Pat. No. 6,951,604 (by Katayama, N. et. al) detail the electroplating of metals onto non-conductive surfaces and flexible boards. The solvents used in etching process are often corrosive and limit the choice of substrates for printing conductive patterns. Consequently, conventional etching processes are not economically viable for rapid prototyping and/or low volume/customized manufacturing of electric circuits. For these reasons, direct printing of conductive patterns has attracted tremendous attention in recent years.

The printing of electrically conductive inks has been known for quite some time (dating back to one of the early U.S. Pat. No. 3,043,784 by Remer, R. K. which discloses the formulation of carbon particles based conductive inks). Further improvements to the concept of generating electrically conductive coatings including graphite, metal flakes and metal coated glass spheres could be found in the U.S. Pat. No. 4,410,307 (by Collins, E. J. et. al. in the context of flash lamp array circuits); U.S. Pat. No. 5,098,771 (by Friend, S. O. on the use of carbon fibrils for conductive inks), U.S. Pat. No. 6,555,024 (by Ueda, T. et. al on formulation of pressure sensitive conductive ink formulations). Further, U.S. Pat. No. 5,286,415 by Buckley, M. S. et. al., report the formulation of aqueous, silver metal based conductive inks for thick film formation. However, all of the above mentioned patents suffer from the limitations of using conductive particles (i.e., carbon or graphite or metal particles) that provide only certain range of conductivities (typically low when compared to metal traces) with low printing resolutions and have prolonged curing times. Further, the above ink formulations are amenable to a few specific printing methods, materials and coating thicknesses and have limited applications and relevance in the context of modern printed electronics (e.g., PCBs, digital displays, RFID tags and photovoltaic cells) that demand faster and cost effective manufacturing processes.

WO 03/050824 by Johan, L. et. al discloses the formation of conductive traces using polyanions and intrinsically conductive polymers. However, organic conductors have poor stabilities compared to their inorganic counterparts such as metals and metal oxides, which exhibit wide range of conductivities and a variety of functional properties. Therefore, the metal or metal oxides based conductive coatings disclosed herein offer distinct chemical, physical, electrical and functional properties that cannot be obtained by organic conductive coatings.

Park, B. K. et. al report the direct writing of copper conductive patterns in Thin Solid Films, 515, 2007 (7706-7711) using inkjet printing methods, where copper particles were dispersed in the premixed solvent followed by ball milling for 12 hours and filtering through a 5 µm nylon mesh prior to printing. Finally, the printed coatings are sintered at high temperature under vacuum conditions. Although, the patterns generated are granular and have reasonable conductivities, and resolutions, the cumbersome processes involved makes it impractical for any commercial applications.

Physical Vapor Deposition (PVD), sputtering and Chemical Vapor Deposition (CVD) and related techniques are known to produce high quality conductive patterns, but high equipment, materials, and related costs, and low productivity make them difficult to be cost competitive against direct printing methods that are continuous. Therefore, there exists a need for printing a broad range of conductive elements and patterns with varying degree of viscosities, chemical compositions and functionalities using a simple printing methodology that is faster, continuous and cost effective. The present invention of self-patterning substrates eliminates the limits of several of the existing electronic feature printing methodologies by accommodating a wide range of coating techniques, viscosities and chemical composition by taking advantage of pre-coated single or multilayer complementary reactant coatings formulations that are electrically resistant or insulating and generate conductive patterns/coatings in response an external source of energy.

The present invention provides an alternate direct printing method for generating conductive traces on rigid and flexible substrates that are pre-coated either in part and/or in full with single and/or multiple layers of complementary chemical reactant formulations, which are electrically resistant. The transformation of resistant layers selectively into conductive traces on demand by an external energy source (such as localized source of heat, spark, microwave, pressure, light or laser or optical or electromagnetic or photochemical radiation) results in required conductive patterns with high resolution. The complementary reactant formulations may also be coated onto rigid or flexible substrates bearing conductive surfaces so that the conductive layers could be selectively turned into electrically resistant layers in order to generate conductive patterns in a subtractive fashion. These self-patterning substrates offer rapid and cost effective methods for printing electrical circuits for a variety of applications, such as Printed Circuit Boards (PCBs), antennas (RFID), flex/micro circuits, customized/disposable electronics, digital displays, photovoltaics, transistors, medical diagnostics and drug delivery devices.

BRIEF SUMMARY OF THE INVENTION

Therefore the prime objective of the present invention is to provide a process for making electrically conductive traces on a substrate that is pre-coated with at least a layer of electrically resistant/insulating reactant formulations using an external energy source (e.g., heat or laser) without the aid of conventional etching methods.

Such as herein described there is provided a process for making self-patterning substrates comprising the steps of: providing electrically conductive traces on a substrate; pre-coating the substrate with at least a layer of complementary reactant electrically resistant reactant formulations; altering the conductivity of complementary reactant formulation selectively upon application of external source of energy.

As per another exemplary embodiment of the present invention wherein the pre-coated formulation layer(s) with high electrical resistance comprise fine particles (i.e., less than 50.0 µm, preferably less than 10.0 µm, yet more preferably less than 1.0 µm) of in-organics such as metals, metal oxides/sulfides, metal alloys, metal salts, organometals, and coordination complexes or combinations thereof.

As per another exemplary embodiment of the present invention wherein the pre-coated formulation layer(s) with high electrical resistance comprise metal salts, coordination complexes or metal oxides, precursors of metals and reducing agents or precursors of reducing agents.

As per another exemplary embodiment of the present invention, when one of the multi-layer coatings on the surface of the substrate is conductive (e.g., Kapton or FR4 coated/electroplated with copper, nickel or aluminum), the coating formulation on top of conductive coating comprises oxidizing agents, precursors of oxidizing agents, coordination or molecular complexing/chelating agents that selectively react with metal layer and form electrically resistant/insulating metal salts, metal oxides, complexes or combinations thereof.

As per another embodiment of the present invention the electrically resistant formulations are deposited using a printing process selected from the group consisting of dip coating, inkjet printing, flexography, offset printing, gravure printing, rotary press, gap/blade coating, screen printing, pad printing, thermal printing, aerosol jet printing, transfer printing, tip dispensing, Meyer Bar, electro-photographic printing, and lithography.

Another embodiment is provided wherein the reactant formulation comprises sequestering materials such as surface overcoats, layered compounds, clays, polymers, porous solids that release a conductive trace forming agent (oxidizing, reducing, or coordinating, metal particle, metal precursor or a catalyst) as a function of external energy source. Further, the reactant or protective coatings may comprise binders, crystallization inhibitors, dispersants, surfactants, humectants, de-foamers, and the like.

Yet another embodiment is provided wherein the reactant formulation comprises precursors of metal oxidizers or reducers or catalysts that coexist without undergoing any significant chemical changes under ambient conditions. The external energy source may trigger a spontaneous redox reaction leading the formation of conductive patterns. Moreover the conductive trace forming layers may generate 3D conductive patterns in response to variable localized heat sources. Further, any of the above processes could be used for forming conductive traces on non-planar objects.

It may be understood that the present invention of self-patterning substrates could be used in combination with electroless or electroplating, wherein the conductive/semi-conductive traces formed upon will be used as a template or a catalyst or nuclei to further deposit conductive metals or modify/control/improve the resolution and resistance of conductive traces either using similar or dissimilar metals as the case may be.

These together with other objects of the invention, along with the various features of novelty, which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF SUMMARY OF THE ACCOMPANYING DRAWINGS

To enable the invention to be fully understood, preferred embodiments would now be described with reference to the accompanying drawings, in which:

FIG. 2 illustrates a substrate coated with two layers of complementary reactant formulations, of which at least one is electrically resistant in accordance with the present invention.

DETAILED DESCRIPTION

The present disclosure provides self-patterning substrates for electric circuit related applications, where the substrates are pre-coated in part and/or in full with single or multi layers of chemical reactant formulations with complementary redox chemistries or decomposable metal precursors that undergo chemical transformation on demand upon exposure to external source of energy (e.g., localized source of heat from resistive heating, inductive heating, exothermic chemical heating, hot gases, spark, laser; photochemical or mechano-chemical reaction, or microwave or optical or pressure induced reactions) to yield conductive patterns of desired resistance and resolution. The electrical resistance of reactant coating is higher than that of conductive trace being formed for a given surface area.

Figures 1A, 1B:
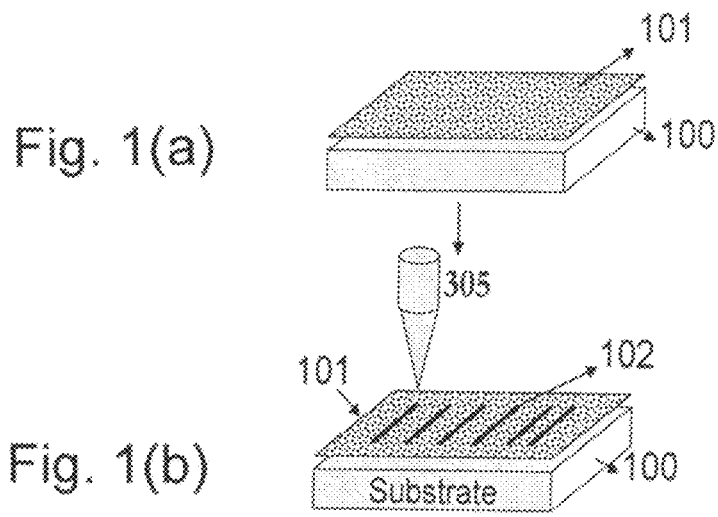
FIG. 1(a) illustrates a substrate coated with a single layer of complementary reactant formulation, which is electrically resistant in accordance with the present invention.
FIG. 1(b) illustrates a substrate coated with a single layer of complementary reactant formulation further comprising conductive traces in accordance with the present invention.

As shown in FIG. 1 (a), a rigid or flexible substrate (100) is coated with a single layer of complementary reactant formulation (101) that is electrically resistant. Further the conductive traces, showed as straight lines as an example, 102, (FIG. 1(b)) are drawn by selectively exposing pre-coated layers to an external energy source. Alternately, complementary reaction chemistries are applied to generate conductive patterns which could be imbedded into two or more stacked layers and the external energy induces reactivity or fusion between two layers which further leads to the formation of conductive patterns.

FIG. 2 illustrates a rigid or flexible substrate (200) coated with two layers (201 and 202) of complementary reactant formulations, of which at least 202 is electrically resistant. An external source of energy (305) is used to make the two complementary reactants undergo chemical transformation to form conductive traces of desired resistance and resolution.

Further, if necessary, one of the components of redox chemistry (i.e., conductive precursors, reducing/oxidizing agents, fine metal particles) could be sequestered and released as a function of temperature to form conductive traces. For example, layered materials (e.g., clays, silicates, aluminates, titanates, layered double hydroxides, hydroxyl double salts, zirconium hydrogen phosphate etc.) could be used to sequester metals or fine metal particles or reducing/oxidizing agents depending upon the nature of the layered structure. The conductive traces are made of silicon, metals (such as copper, tin, silver, aluminum nickel, gold, platinum, palladium), metal alloys, metal oxides, mixed metal oxides and the like.

The coating formulation comprises conductive fine particles and/or metal precursors such as oxides, hydrides, hydroxides, sulfides, organometals, metal-organics, coordination complexes involving, for example, copper, cobalt, nickel, cadmium, iron, titanium, gallium, germanium, tin, indium, platinum, palladium, aluminum, chromium, manganese, silver, zinc, and gold. Some examples of the metal precursors involving copper and silver are: $CuX$, $CuX_2$; $X=Cl$, $Br$, $I$ $CuH_2$, $Cu(SO_4)_2$, $Cu(acetate)_2$, $Cu(formate)_2$, $Cu(formate)$, $Cu(NO_3)_2$, $Cu_2O$, $CuO$, $Cu(aminoalkoxide)$, $Cu(hfa)_2$, $Cu(hfa).L$, $Cu(hfa).TMVS$, $Cu(hfa)(cyclooctadiene)$; $Cu_2(\mu-Et_2NCH_2CH_2O)_2(NCO)_2$, $Cu_2(\mu-Et_2NCH_2CH_2O)_2(NO_2)_2$; hfa=hexafluoroacetylacetonate, TMVS=trimethylvinylsilane, L=CO, phosphine, alkene or alkyne and silver: $AgCl$, $AgBr$, $AgI$, $Ag_2CO_3$, $AgIO_3$, $AgNO_3$, carboxylic acid salts of silver, $Ag(hfa)_2.H_2O$; $Ag(hfa).(tetraglyme)$, $Ag(hfa)(diglyme)$.

The preferred metal precursors of coating formulation may be represented by generic formula: $[(L)_xM(A)_y(S)_z]^c$, Where L is the ligand or chelate or combination of ligands containing organic moieties such as amines, ammonia, phosphanes, boranates, phosphates, isocyanide, alkene, alkyne, carboxylate, alkoxide and diketones or combinations thereof. "A" may be any organic or inorganic anion such as formate, carboxylates, imines, halides, sulfates, oxides and so on. The solvate molecule, S, may be aqueous ($H_2O$) or non aqueous (e.g. alcohols, acids, esters, alkanes, aromatics, amines, amides, ethers, silanes, phosphates, nitriles, phosphates, thiols, terpenes, sulfoxides and the like). The ligand, L, anion, A, and solvate, S may coordinate to the metal center, M, or may be just part of the complex or supra-molecular structure through non-covalent interactions or both.

The values of x and y may be such that the neutrality of the metal center M is maintained and that the net charge c is zero. The typical values of x, y and z may be between 0 to 10, preferably between 1-4. However, depending on the nature of ligand, L and anion, A, and the values of x and y, there may be a net negative or positive charge "c" on the coordination complexes in the range of −10 to +10, but preferably between −4 and +4. When c is negative, the complex may be stabilized by cations (e.g., $NH_4+$, Na+ and so on). When c is positive, the complex may be stabilized anions (e.g., carboxylates, formate, halides). M may be any conductive or semi-conductive element/metal, the preferred metals, M of the above formula are copper, silver, zinc, cobalt, nickel, aluminum, gallium, gold, iron, indium, platinum, and palladium.

The conductive materials or their precursors are co-formulated with complementary binders and/or chemical reagents such as reducing or oxidizing agents, chelating or coordinating agents, passive or protective layers as required. The coatings are formulated in such a way that they do not undergo any significant chemical reaction, under ambient or operational conditions, unless they are exposed to an external energy source (leading to reduction in electrical resistance).

The complementary reducing agents that react with metal precursors to form conductive traces include hydrogen, carbon monoxide, carbon dioxide, metal hydrides, sodium hypophosphite, formaldehyde, formic acid, dimethylamine borane, hydrazine, pyrazoline, ammonia, hydroxylamine, glycerol, dihydrobenzofuran, 9BBN, silanes, metals, metalloorganic decomposition materials, negatively charged ionic reducing gas and several other organic/inorganic reducing agents known to those skilled in the art. Also, the reduction of metal precursors (or the chemical reactions leading to the formation of conductive traces) may be carried out under ambient conditions, or under reducing or inert atmosphere or vacuum conditions as required.

The complementary oxidizing agent that turn conductors into non-conductors include precursors of oxidizing agents, oxygen, chlorates, perchlorates, permanganate, chromate, polyoxides, alkali metals or alkaline earth metals, transition or lanthanide metals, transition metal oxides, coordination complexes, inorganic acids such as HCl, HBr, $H_2SO_4$, $HNO_3$, phosphoric acids, and their corresponding salts, molecular or polymeric organic acids such as carboxylic acids, sulfonic acids, phosphoric acids, and their corresponding salts, quinones and several others known to those skilled in the art.

The coordinating or chelating or complexing or salt forming agents are optionally used in combination with oxidizing or reducing agents to control the formulation stability, coating properties, and the uniform conductive trace formation with required resistance and resolution. The molecular or polymeric ligands containing hetero atoms, N, O and S such as primary, secondary and tertiary amines, alcohols, acids, esters, sulfonates, phosphonates, ethers and thiols and thioethers and several other metal coordinating ligands known to those skilled in the art.

A variety of binders could be optionally used to coat the complementary reactant formulations on substrates. The binders are chosen in such a way that they provide strong adhesive and cohesive binding and facilitate the reaction chemistry that transforms the resistive layers into conductive patterns with high resolution. Typically, the binders are resistant to high temperatures and can actively or passively influence the conductive trace formation and its resolution. The inorganic binder solutions may be selected from the group including clays (synthetic and natural), phosphates, alkoxides, inorganic polyanions/polycations, diatomaceous earth, sol-gels, aluminates, borates, silicates, titanates, zirconates, ceria and/or combinations thereof. The binders could be polymeric (homopolymer or a multipolymer). Some preferred binders include thermoset resins, thermoplastic resins, or combinations thereof. The water-soluble polymers such as poly(vinyl alcohol), poly(vinyl pyrrolidone), gelatin, cellulose ethers (such as hydroxypropyl cellulose or hydroxypropyl methyl cellulose) poly(oxazolines), poly(vinylacetamides), partially hydrolyzed poly(vinyl acetate/vinyl alcohol), poly(acrylic acid), poly(acrylamide), poly(alkylene oxide), sulfonated or phosphated polyesters and polystyrenes. The other optional additives of the coating formulation may include crystallization inhibitors, dispersants, surfactants, humectants, defoamers and the like.

A variety of substrates are contemplated for use in the preparation of electric circuits according to the invention. Exemplary materials include metals to non-metals, conductors to insulators, flexible to inflexible materials. Some of the preferred substrates include, ceramics, composites, glass, fiberglass, laminated boards, or epoxy/phenolic materials impregnated with fibers or fibrous materials, carbon, silicon, silica, alumina, boria, titania, plastic, thermally stable polymers such as amides, imides, Kapton, carbonates, esters, metal foils (e.g., steel), metals coated with electrically resistant organic/inorganic layers (e.g., polymers, silicates, silica, alumina, zirconia etc.), textiles and the like. The substrates mentioned above may be surface modified in order to be able to coat the complementary reactant formulations with good adhesive and cohesive binding properties as required. The surface of any of the above mentioned substrates could be porous, rougher or smoother (like in case of silicon or semiconducting wafers).

Figure 3:
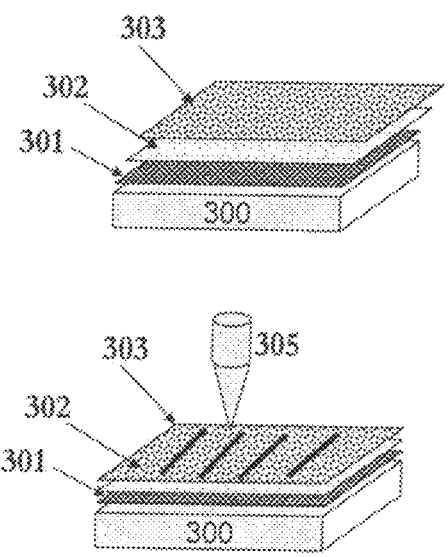
FIG. 3 illustrates a substrate coated with three distinct layers of complementary reactant formulations, of which at least one layer is electrically resistant in accordance with the present invention.

Also, the energy/heating source (305) could simply decompose metal precursors or induce a redox reaction or change the pH of the pre-coated layer(s) locally as a function of temperature and thereby generate conductive traces. The localized heating source is generated using resistive heating, inductive heating, exothermic heating, hot gases or aerosol, laser/light or spark sources. Also, as an example the FIG. 3 illustrates a rigid or flexible substrate (300) coated with three distinct layers of complementary reactant formulations, of which at least 302 is electrically resistant. Reactant layer 302 could be a passive/protective layer that inhibits the chemical reaction between 301 and 303 or could be an active layer that participates in the chemical reaction when the substrate is subjected to external source of energy (305) to directly print conductive pattern.

It may not be necessary to include metal reducing/oxidizing agents in a coating formulation to generate conductive traces, as some of the metal-organic compounds/metal salts/metal oxides readily decompose to form conductive metals upon exposure to heat.

Figure 4:
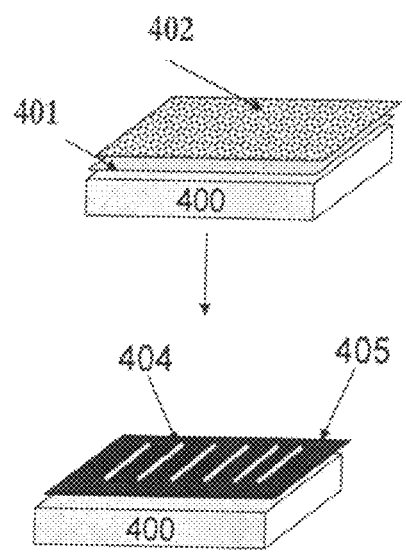
FIG. 4 illustrates a substrate coated with a conductive layer, which has an overcoat of electrically resistant complementary reactant formulation in accordance with the present invention.

Further, an overcoat layer on substrates may comprise redox chemistries that are exothermic in nature and result in synthesis of conductive traces The conductive trace formation is not necessarily restricted to a single layer, a three dimensional conductive pattern could be formed with an appropriate choice of multi-layer coatings, where the conductive traces are formed in response to variable heating temperatures. Although, the external energy source is used to convert a resistive layer into conductive layer, the reverse is also possible, where the conductive layer is selectively turned into a resistive layer upon exposure to external energy source. Such a conversion provides a subtractive method for forming conductive traces (for example, reaction of silver or copper metals with oxidizing and coordinating/chelating agents results in the formation of resistive coating layers) from self-patterning substrates. Therefore FIG. 4 illustrates a rigid or flexible substrate (400) is coated with a conductive layer (401) that has an overcoat of electrically resistant complementary reactant formulation (402). Highly selective initiation of reaction between the layers 401 and 402 with an external energy source leads to the formation of electrical resistant end product (405) leading to the formation of conductive pattern in a subtractive mode without any need for physically etching away the metal.

Figure 5:
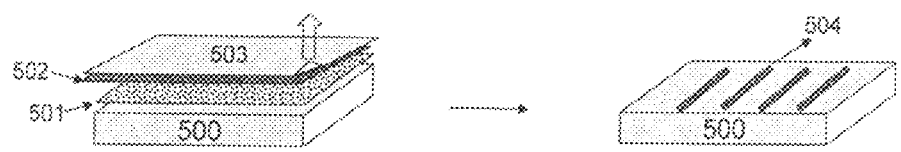
FIG. 5 illustrates a substrate optionally coated with one of the layers of self-patterning formulation, while a complementary coating layer is deposited onto a separate disposable substrate in accordance with the present invention.

The FIG. 5 illustrates a rigid or flexible substrate (500) optionally coated with one of the layers of self-patterning formulation (501), while a complementary coating layer (502) is deposited onto a separate disposable substrate (503). At the time of conductive pattern formation, substrate 503 is physically placed on top of the substrate to be coated (i.e., 500). Application of an appropriate external energy source (heat, light, laser, pressure, microwave, chemical) imprints a conductive trace selectively with required resistance and resolution (like a trace paper).

The source of heat may come from resistive heating or inductive heating or chemical heating or through hot gases such as nitrogen, oxygen, hydrogen, air, carbon dioxide, carbon monoxide, noble gases and so on or hot aerosols containing metal precursors or laser or light or spark or pressure. The resolution of the conductive trace will be defined by localization of the heat source/heat profile and the chemical kinetics of the conductive trace formation. It is also possible to overcoat electrically resistant layers with appropriate exothermic reactants (e.g., thermite or inter-metallic) to accomplish instant high temperatures ranging from 100 to 1000° C. for short periods of time.

The heating profiles play a key role in defining the resolution and quality of the conductive traces and it is also possible to heat complementary chemical reactant formulations coated on plastic or polymeric substrate to very high temperatures without damaging the substrate (i.e., by controlling the heat profile/thermal energy transfer properties). Rapid heating and cooling (with the aid of internal or external heat sinks, if necessary) of the pre-coated complementary reactant formulations may promote the formation of pure metallic conductive traces with fine/high resolutions and prevent the formation of unwanted metal oxides, especially when the conductive metals are air sensitive. However, use of inert/reducing atmospheres or vacuum conditions may additionally promote the high quality metal trace formation. Those skilled in the art can identify the relationship between the time, heat transfer profiles/chemical kinetics to define the resolution and quality of conductive traces for a given coating.

The typical temperatures required to initiate the chemical reaction to generate conductive patterns may vary anywhere from 75° C. to 800° C. depending on the high temperature resistance of substrates and the nature of complementary reactant coating formulation. For example, when the plastic or polymeric substrates are used for printing conductive patterns, the temperatures may range between 100-350° C. However, if metallic and ceramic substrates are used for conductive patterns, the temperature tolerances could go up to 800° C. The preferred temperatures for initiating complementary reaction formulation are expected to be below 400° C.

There may be an additional/optional protective layer on top of conductive trace forming layer(s). This protective layer is chosen in such a way that it provides excellent shelf life to printed circuit boards, withstands high temperatures and will not undergo go any chemical transformation that would be affect the performance of conductive traces.

The self-patterning substrates proposed here offer rapid and cost effective ways of prototyping and manufacturing conductive or semi-conductive traces for electric circuit and transistor related applications such as printed circuit boards, antennas (RFID), flex circuits, batteries, toys, disposable electronics, customized/disposable electronics, microelectronics, digital displays, photovoltaic cells, medical diagnostics and drug delivery systems. The expressions "resistive" coatings used here may refer to coatings, which will pass electrical currents at different degrees or insulating. Whether a coating is deemed resistive or conductive depends on how freely it passes an electrical current, the expression conductive pattern is intended to include both semi-conductive (i.e., resistive) and conductive coatings. The conductive traces mentioned here may constitute either pure metals (e.g., copper) or mixed metals (e.g., copper and zinc) or core/shell particles or combination of conductive/semiconductive elements (including metal oxides).

Example 1

The coating formulation for generating self-patterning substrates was made by adding aminoacetaldehyde diethyl acetal directly to copper formate (or its aqueous saturated solution) until the light blue color solid (or solution) turns into a viscous dark blue color liquid. To this solution, a small percentage of silicate binder was added to achieve required formulation consistency for coating over a metallic substrate. A thin coating of this formulation was uniformly spread onto a 0.5 mil thick steel foil. This electrically resistant pre-coated formulation was selectively turned into conductive traces through resistive heating using a 9V DC battery (or four 1.5 M alkaline batteries). One of the electrodes of the battery (positive or negative) was directly connected to steel foil, while the second electrode was connected to a fine metallic needle. The electrically resistant coating was turned into conductive copper trace by writing a pattern on the steel surface (i.e., on the second surface of steel on which there is no coating formulation) using the metallic needle with a fine tip. The contact between the metallic needle and the metal foil surface generates very high local temperatures rapidly through resistive heating (appearance of spark may also be noticed). The above heating mechanism selectively heats the substrate to the high temperatures and quickly cools them to ambient temperatures. We believe that such a rapid heating and cooling mechanism promotes the formation of high quality of conductive traces with required resistance and resolution. The above experiment could be conducted under reducing or inert atmosphere or under vacuum conditions to further optimize the conductive trace formation as required.

Example 2

The coating formulation for generating self-patterning substrates was made by dissolving silver acetate in warm 2-methoxy ethylamine until all the solids are dissolved and a viscous solution was obtained. A thin coating of this viscous formulation was uniformly spread onto a 0.5 mil thick steel foil. This electrically resistant pre-coated formulation was selectively turned into conductive traces through resistive heating using a 9V DC battery (or four 1.5 AA alkaline batteries). One of the electrodes of the battery (positive or negative) was directly connected to steel foil, while the second electrode was connected to a fine metallic needle. The electrically resistant coating was rapidly turned into conductive silver trace by writing a pattern on the steel surface (i.e., on the second surface of steel on which there is no coating formulation) using the metallic needle with a fine tip. The contact between the metallic needle and the metal foil surface generates very high local temperatures rapidly through resistive heating (appearance of spark may also be noticed). The above experiment could be conducted under reducing or inert atmosphere or under vacuum conditions to further optimize the conductive trace formation as required.

Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

We claim:

1. A process for making self-patterning substrates comprising:
    providing electrically conductive traces on a substrate by:
    coating the substrate at least partially with at least a layer of complementary reactant electrically resistant reactant formulation exhibiting a higher electrical resistance with respect to final conductive traces generated for a given coating surface area and thickness;
    altering conductivity of the complementary reactant electrically resistant reactant formulation by applying energy from a source of energy to the layer to form the electrically conductive traces; and
    triggering a redox reaction leading to a formation of the electrically conductive traces,
    wherein the complementary reactant electrically resistant reactant formulation comprises at least one of precursors of metals, precursors of oxidizers oxidizing the complementary reactant electrically resistant reactant formulation, and precursors of reducers reducing the complementary reactant electrically resistant reactant formulation, and
    the precursors of oxidizers or the precursors of reducers are capable of not undergoing chemical reactions under a temperature in a range from 10 to 40° C.

2. The process for making self-patterning substrates as claimed in claim 1, wherein a single face of the substrate is coated with at least the layer of complementary reactant electrically resistant reactant formulation exhibiting the higher electrical resistance with respect to the final conductive traces generated for the given coating surface area and thickness.

3. The process for making self-patterning substrates as claimed in claim 1, wherein for the given coating surface area, an electrical resistance of a coating of the complementary reactant electrically resistant reactant formulation is higher than an electrical resistance of the electrically conductive trace being formed.

4. The process for making self-patterning substrates as claimed in claim 1, comprising coating the substrate with a plurality of layers of complementary reactant electrically resistant reactant formulations which are stacked on each other.

5. The process for making self-patterning substrates as claimed in claim 4, wherein the plurality of layers of the complementary reactant electrically resistant reactant formulations forms three-dimensional conductive trace patterns by applying heat energy from the source of energy.

6. The process for making self-patterning substrates as claimed in claim 4, wherein the plurality of layers of the complementary reactant electrically resistant reactant formulations is in solid state and/or semi-solid state and/or liquid state under the temperature in the range from 10 to 40° C. and atmospheric pressure.

7. The process for making self-patterning substrates as claimed in claim 4, wherein in the coating of the substrate, the plurality of layers of the complementary reactant electrically resistant reactant formulations do not undergo any chemical reaction, under ambient or operational conditions, until the applying of the energy from the source of energy that changes the electrical resistance of the complementary reactant electrically resistant reactant formulations.

8. The process for making self-patterning substrates as claimed in claim 4, wherein the electrically conductive traces generate 3D conductive patterns by the applying of the energy from the source of energy.

9. The process for making self-patterning substrates as claimed in claim 1, wherein the complementary reactant electrically resistant reactant formulation comprises particles of inorganics comprising one selected from the group consisting of metals, metal oxides, metal sulfides, metal alloys, metal salts, organometals, coordination complexes, the precursors of metals, reducing agents, and the precursors of reducers.

10. The process for making self-patterning substrates as claimed in claim 1, wherein
single or multiple layers of the complementary reactant electrically resistant reactant formulation is capable of undergoing chemical transformation by the applying of the energy from the source of energy, and
the source of energy comprises at least one selected from the group consisting of a heat source, light, a resistive heat source, an inductive heat source, hot gases, an exothermic chemical heat source, a spark generator, laser, a photochemical reaction source, a mechano-chemical reaction source, a microwave, an optically-induced reaction source, and a pressure induced reaction source, to yield electrically conductive patterns of a predetermined resistance and a predetermined resolution.

11. The process for making self-patterning substrates as claimed in claim 10, further comprising heating the layers in order to change a pH of the layers of the complementary reactant electrically resistant reactant formulation(s) thereby generating electrically resistive traces or the electrically conductive traces.

12. The process for making self-patterning substrates as claimed in claim 1, wherein the electrically conductive traces include one selected from the group consisting of pure metals, mixed metals, metal alloys, metal oxides, mixed metal oxides, electrically-conductive elements, and electrically semi conductive elements.

13. The process for making self-patterning substrates as claimed in claim 1, wherein the complementary reactant electrically resistant reactant formulation comprises electrically conductive precursors which are capable of undergoing chemical reaction and producing heat, thereby forms the electrically conductive traces.

14. The process for making self-patterning substrates as claimed in claim 1, wherein the electrically conductive traces include an electrically semi conductive coating, an electrically resistive coating, and/or an electrically conductive coating.

15. The process for making self-patterning substrates as claimed in claim 14, wherein the electrically conductive traces comprise electrically semi-conducting elements selected from the group consisting of silicon, selenium, tellurium, copper, silver, aluminum nickel, gold, metal alloys, and metal oxides thereof.

16. The process for making self-patterning substrates as claimed in claim 1, wherein
the complementary reactant electrically resistant reactant formulation comprises sequestering materials, and
the complementary reactant electrically resistant reactant formulation is in a form selected from the group consisting of surface overcoats, layered compounds, clays, polymers, and porous solids.

17. The process for making self-patterning substrates as claimed in claim 1, wherein the source of energy is selected from the group consisting of a resistive heat source, an inductive heat source, hot gases, an exothermic chemical heat source, an optical heat source, laser, light, and a spark generator.

18. The process for making self-patterning substrates as claimed in claim 1, further comprising heating and cooling the substrate to promote a formation of pure metallic conductive traces with resolutions less than 20 microns thereby preventing a formation of a predetermined kind of metal oxides.

19. The process for making self-patterning substrates as claimed in claim 1, wherein the complementary reactant electrically resistant reactant formulation comprises at least one selected from the group consisting of metal salts, metal oxides, organometals, the precursors of metals, reducing agents and the precursors of reducers.

20. The process for making self-patterning substrates as claimed in claim 19, wherein the complementary reactant electrically resistant reactant formulation includes electrically conductive particles having a size of less than 100 microns and/or the precursors of metals selected from the group consisting of oxides, hydrides, hydroxides, sulfides, organ metals, metal-organics, coordination complexes involving copper, cobalt, nickel, cadmium, iron, titanium, gallium, germanium, tin, indium, platinum, palladium, aluminum, chromium, manganese, silver, zinc, and gold.

21. The process for making self-patterning substrates as claimed in claim 1, further comprising depositing conductive metals on the substrate thereby controlling resolution and resistance of the electrically conductive traces using an electroless or an electro-plating based process.

22. The process for making self-patterning substrates as claimed in claim 1, wherein the substrate comprises a material selected from the group consisting of metals, non-metals, electric conductors, electric insulators, porous materials, non-porous materials, and flexible and inflexible materials selected from the group consisting of plastic, polymers, resin, ceramic, glass, metal, metal oxides, and organic-inorganic composites.

23. The process for making self-patterning substrates as claimed in claim 1, wherein the substrate comprises a material selected from the group consisting of ceramics, composites, glass, fiberglass, laminated boards, epoxy materials impregnated with fibers, epoxy materials impregnated with fibrous materials, phenolic materials impregnated with fibers, phenolic materials impregnated with fibrous materials, carbon, silicon, silica, alumina, boria, titania, plastic, amides, imides, kapton, carbonates, esters, metal foils coated with thin inorganic electrically resistant layers of silica, alumina, zirconia, and textiles.

24. The process for making self-patterning substrates as claimed in claim 1, further comprising co-formulating the electrically conductive traces or precursors of the electrically conductive traces with reducing agents, oxidizing agents, chelating agents, binders, passive layers, or protective layers.

25. The process for making self-patterning substrates as claimed in claim 1, wherein the coating of the complementary reactant electrically resistant reactant formulation comprises particles of inorganics having a size of less than 100 microns and particles selected from the group consisting of metals, metal oxides, metal sulfides, metal alloys, metal salts, organometals, and coordination complexes.

26. The process for making self-patterning substrates as claimed in claim 1, wherein the complementary reactant electrically resistant reactant formulation is further coated with at least one selected from the group consisting of binders, crystallization inhibitors, dispersants, surfactants, humectants and defoamers.

27. The process for making self-patterning substrates as claimed in claim 26, further comprising applying the binders on the substrate before the coating of the complementary reactant electrically resistant reactant formulation, thereby binding the complementary reactant electrically resistant reactant formulation to the substrate, wherein the binders are adhesive and cohesive binders which are capable of facilitating reaction chemistry that transforms resistive layers into conductive patterns with resolutions less than 20 microns.

28. The process for making self-patterning substrates as claimed in claim 27, wherein the binders include one selected from the group consisting of synthetic clays, natural clays, phosphates, alkoxides, inorganic polyanions, inorganic polycations, diatomaceous earth, sol-gels, aluminates, borates, silicates, titanates, zirconates, ceria, polymers, thermoset resins, and thermoplastic resins.

29. The process for making self-patterning substrates as claimed in claim 1, further comprising
depositing the complementary reactant electrically resistant reactant formulation on the substrate, and
conducting the depositing of the complementary reactant electrically resistant reactant formulation by a printing process selected from the group consisting of dip coating, inkjet printing, flexography, offset printing, gravure printing, rotary press, screen printing, pad printing, transfer printing, thermal printing, aerosol jet printing, tip dispensing, gap coating, blade coating, Meyer Bar coating, electrophotographic printing, and lithography.

30. The process for making self-patterning substrates as claimed in claim 1, wherein the electrically conductive traces are formed under an atmosphere selected from the group consisting of ambient condition, reducing condition, inert condition, and vacuum condition.

31. The process for making self-patterning substrates as claimed in claim 1, wherein the layer of the complementary reactant electrically resistant reactant formulation comprises an electrical resistance that is ten times the electrical resistance of the final conductive traces generated for the given coating surface area and thickness.

* * * * *